United States Patent [19]

Hashimoto et al.

[11] Patent Number: 5,252,430
[45] Date of Patent: Oct. 12, 1993

[54] FINE PATTERN FORMING METHOD

[75] Inventors: Kazuhiko Hashimoto, Moriguchi; Noboru Nomura, Kyoto, both of Japan

[73] Assignee: Matsushita Electric Industrial Co., Ltd., Osaka, Japan

[21] Appl. No.: 812,839

[22] Filed: Dec. 20, 1991

Related U.S. Application Data

[63] Continuation of Ser. No. 599,822, Oct. 19, 1990, abandoned.

[30] Foreign Application Priority Data

Oct. 25, 1989 [JP] Japan .................................. 1-278840

[51] Int. Cl.$^5$ .............................................. G03C 5/00
[52] U.S. Cl. ................................... 430/296; 430/270; 430/311; 430/313; 430/330; 430/942
[58] Field of Search ............... 430/5, 270, 296, 311, 430/312, 313, 314, 323, 325, 330, 942

[56] References Cited

U.S. PATENT DOCUMENTS

| | | | |
|---|---|---|---|
| 4,689,289 | 8/1987 | Crivello | 430/270 |
| 4,863,833 | 9/1989 | Fukuyama et al. | 430/296 |
| 4,939,070 | 7/1990 | Brunsvold et al. | 430/296 |
| 4,968,583 | 11/1990 | Ohshio | 430/296 |
| 5,019,485 | 5/1991 | Nakamura | 430/296 |
| 5,110,711 | 5/1992 | Babich | 430/296 |

*Primary Examiner*—Marion E. McCamish
*Assistant Examiner*—Kathleen Duda
*Attorney, Agent, or Firm*—Stevens, Davis, Miller & Mosher

[57] ABSTRACT

The fine pattern forming method includes the steps of applying an organic polymer film on a semiconductor substrate and heat treating the same; applying a resin solution (including an acid degradation polymer or an acid reactive monomer, an acid generator capable of generating an acid by irradiation with an electric charged beam, and a silicone resin) on the organic polymer layer and heat treating the same; carrying out a heat treatment after a pattern is written, causing the generated acid to react with the acid degradation polymer or the acid reactive monomer and carrying out a development in an alkaline solution to form a resist pattern; and etching the organic polymer layer using the resist pattern as a mask. The use of the resist layer including the silicone resin, the acid generator, and the acid degradation polymer or the acid reactive monomer enables an accurate fine resist pattern to be formed which has a high sensitivity and dry etching resistance, and in which charging is prevented when a pattern is written by a charged beam.

8 Claims, 3 Drawing Sheets

FINE PATTERN FORMING METHOD

This application is a continuation of application Ser. No. 07/599,822, filed Oct. 19, 1990 now abandoned.

BACKGROUND OF THE INVENTION

1. Field of the Invention

The present invention relates to a fine pattern forming material used when semiconductor devices and integrated circuits are made by forming a pattern thereon using an electron beam, and to a fine pattern forming method using such material.

2. Description of the Prior Art

Conventionally, in the manufacture of ICs and LSI circuits, patterns are formed by photolithography using ultraviolet rays. To cope with a requirement to make devices smaller in size, a numerical aperture of a stepper lens is increased and a light source having a shorter wavelength is used, which results in a drawback in that a focus depth is shortened. Further, as a pattern of LSI devices is made finer in size and ASICs are put into production, electron beam lithography has been used Positive type electron beam resists are indispensable to form a fine pattern by electron beam lithography. Polymethyl methacrylate (PMMA) is known as a resist having the best resolution among them, but it has a drawback of low sensitivity. Thus, recently, there have been numerous reports relating to improving the sensitivity of positive type electron beam resists, in which reference is made to positive type resists such as polybutyl methacrylate, a copolymer of methyl methacrylate and methacrylic acid, a copolymer of methacrylic acid and acrylonitrile, a copolymer of methyl methacrylate and isobutylene, polybutene-1-sulfon, polyisopropenyl ketone, fluoro polymethacrylate, and the like. These resists, which aim at an improvement in sensitivity, are arranged such that an electron withdrawing group is introduced to the side chain or an easily degradable bond is introduced to the principal chain thereby to enable an electron beam to easily scissor the principal chain, but they cannot sufficiently improve both resolution and sensitivity. Further, since they do not have sufficient dry etching resistance and heat resistance, they are difficult to be used as a mask for dry etching, and thus a field to which they are applicable is limited.

Negative type electron beam resists using cyclized rubber as a base have inferior adhesion to a substrate, thus suffering a drawback in difficulty in forming a coated uniform layer of high quality without pin holes on the surface of the substrate and inferior heat stability and resolution. Therefore, conventionally, various improvements have been made to the negative type electron beam resists. For example, negative type electron beam resists such as polyglycidyl methacrylate, chloro methyl polystyrene, chloro methyl α- methyl polystyrene, polymethacrylate maleic acid ester, polystyrene chrolide, a copolymer of glycidyl methacrylate and ethyl acrylate, and the like are reported. These resists, which aim at an improvement in sensitivity, are arranged such that an epoxy group easily reactive to electrons and chlorine atoms are introduced thereby to enable an electron beam to easily produce a radical to cause a cross-linking reaction, but do not have sufficient resolution and heat resistance. Although an organic solvent is needed to develop these negative type resists comprising a rubbery thermoplastic polymer using a cyclized rubber or polyisoprene as a base, the resists on which a pattern is written may be swelled in the organic solvent developer while they are developed. As a result, the resolution of the pattern is lowered, and sometimes the pattern is distorted and unable to be used. In addition, the organic solvent developer is harmful to the environment and health and further is not desirable from the view point of the igniting property thereof.

Electron beam lithography has such drawbacks as an adverse effect to a pattern accuracy caused by the inferior dry etching resistance and heat resistance of electron beam resists and a proximity effect due to forward and backward scattering of electrons, and an adverse effect to a pattern drawing due to charging by incident electrons, and the like. A multi-layer resist, the function of which is shared by its pattern forming layer and planarizing layer, is very effective to compensate for these drawbacks. FIGS. 3A to 3D are diagrams explaining a multi-layer resist process applied to the electron beam lithography. To suppress the proximity effect, an organic polymer film is applied to a thickness of 2 to 3 microns as a bottom layer 31 and subject to a heat treatment (FIG. 3A). Further, an inorganic film of $SiO_2$ or the like, or an inorganic polymer film of SOG (spin on glass) or the like is applied thereon to a thickness of 0.2 micron as an intermediate layer 32, and an electron beam resist is applied to a thickness of 0.5 micron as a top layer resist 33. An aluminum film 34 of about 100 Angstroms is deposited thereon to prevent charging (FIG. 3B). After a pattern is written by an electron beam, the aluminum film 34 is removed with an alkaline solution, then a development is carried out to obtain a resist pattern 33P (FIG. 3C). Next, the intermediate layer 32 is dry etched using the resist pattern 33P as a mask, and further the bottom layer 31 is dry etched using the intermediate layer 32 as a mask (FIG. 3D). The use of the above multi-layer resist process enables a fine pattern to be formed at a high aspect ratio. In the multi-layer resist process in which the aluminum film is deposited, however, manufacturing processes are more complex and have such problems as contamination, an increase in dimensional shift caused when a pattern is transferred, and the like, and thus this process is not applicable to actual use.

As described above, although the multi-layer resist process using an aluminum film is an effective method, it has the problem of complex manufacturing processes, contamination of aluminum, and dimensional variation of the resist when the pattern is transferred.

Further, a multi-layer process not using an aluminum film has a problem of charging, which is a phenomenon wherein incident electrons are stored in a resist, an intermediate layer or a bottom layer, all being insulators. The charging effect causes a serious problem such as deterioration of a field butting accuracy and overlay accuracy, and the like in the electron beam lithography. In addition, the charging phenomenon is also observed in a single layer resist and causes the deterioration of a field butting accuracy and overlay accuracy, as in the three-layer resist. More specifically, incident electrons scattered in a resist in the electron beam lithography stay in a region at a depth of 1 to 1.5 microns from the surface of the resist and a charge is stored in this region. It is supposed that the stored charge causes an electron beam to be curved thereby to deteriorate the field butting accuracy and overlay accuracy.

When a pattern is written by an electron beam, a thick bottom layer must be applied, because a pattern accuracy is greatly affected by the proximity effect.

Thus, a silicon containing resist, inorganic resist, and the like, which not only serve as a mask for the bottom layer but also serve as a resist layer, have been developed. They include a resist having a siloxane bond coupled to the principal chain thereof, ladder type polysiloxane, a chalcogenide glass type inorganic resist and the like, but cannot yet sufficiently improve dry etching resistance and also has inferior sensitivity and resolution. Thus they are far from achieving practical use. Since these resists employ an organic solvent as a developer, they have a large variation in sensitivity and dimension, a smaller process margin, and a problem of environmental pollution and the like.

Since a charging phenomenon is also caused in the two-layer resist process, as in the three-layer resist process, an aluminum film is deposited on a resist to prevent the occurrence of charging. Further, the resist process using an aluminum film has a problem in that a novolac type resist using an organic alkaline solution as a developer cannot be used, because an alkaline solution is used to remove the aluminum film.

The present inventors have developed highly sensitive conducting electron beam resists and a fine pattern forming method using the resists to solve these phenomena.

SUMMARY OF THE INVENTION

An object of the present invention is to provide a material capable of forming a resist film having high sensitivity and dry etching resistance when an electric charged beam direct writing is carried out by an electric charged beam such as an electron beam, focused ion beam, or the like using multi-layer resists, and a method of forming an accurate fine resist pattern without a pattern deformation caused by charging using the material.

To achieve the above object, according to the present invention, an arbitrary accurate fine resist pattern without a pattern deformation caused by charging while writing is carried out is formed by using a material comprising a silicone resin, an acid generator, and an acid degradation polymer or an acid reactive monomer.

A fine pattern forming material according to the present invention comprises an acid degradation polymer, an acid generator capable of generating an acid when an electron beam is radiated, and a silicone resin containing silicon atoms in the principal chain or side chain thereof.

A conducting polysilane polymer or a conducting polysilicone polymer is preferably used as the silicone resin.

Further, the present invention provides a fine pattern forming method comprising the steps of applying an organic polymer film on a semiconductor substrate and heat treating the same, applying a resin solution comprising an acid degradation polymer, acid generator capable of generating an acid by the irradiation with an electric charged beam, and a silicone resin on the organic polymer film and heat treating the same, carrying out a heat treatment after a pattern is written, causing the generated acid to react with the acid degradation polymer and carrying out a development in an alkaline solution to form a resist pattern, and etching the organic polymer film using the resist pattern as a mask.

Further, the present invention provides a fine pattern forming material comprising an acid reactive monomer, an acid generator capable of generating an acid when an electron beam is radiated thereto, and a silicone resin having the principle chain or side chain thereof containing silicon atoms.

Further, the present invention provides a fine pattern forming method comprising the steps of applying an organic polymer film on a semiconductor substrate and heat treating the same, applying a resin solution comprising an acid reactive monomer, an acid generator capable of generating an acid by the irradiation with an electric charged beam, and a silicone resin on the organic polymer film and heat treating the same, carrying out a heat treatment after a pattern is written, causing the generated acid to react with the acid reactive monomer and carrying out a development by an alkaline solution to form a resist pattern, and etching the organic polymer film using the resist pattern as a mask.

According to the present invention, an accurate fine pattern without a pattern deformation caused by charging can be easily formed by the above conducting silicon containing electron beam resists and the resist process using them. In particular, an accurate fine resist pattern can be formed, wherein the deposition of an aluminum film does not needed, a problem of contamination is not arise, a resist process can be simplified, no dimensional shift is caused when a pattern is transferred, a highly sensitive alkaline solution can be used as a developer, and charging caused by writing electrons is prevented. As a result, an accurate fine pattern having high resolution can be formed by the present invention.

DESCRIPTION OF PREFERRED EMBODIMENTS

Figure 1A:
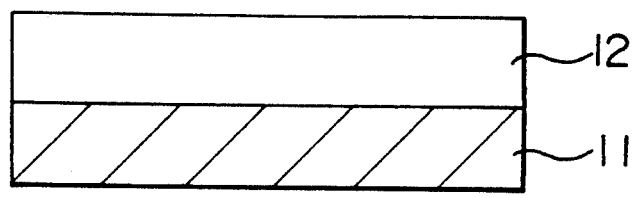
FIGS. 1A to 1D are cross sectional views of a manufacturing process of an embodiment according to the present invention.
Figure 1B:
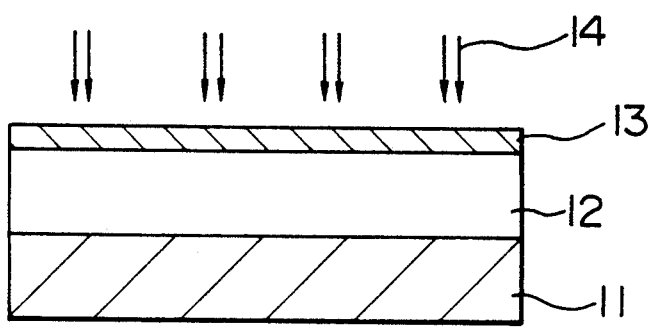
Figure 1C:
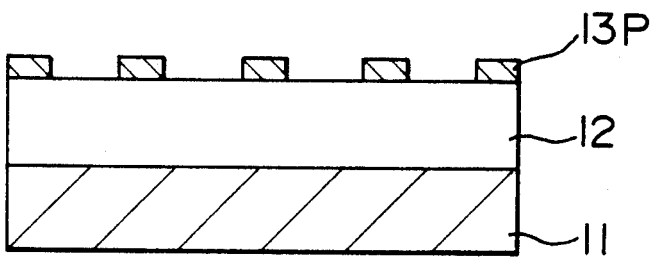
Figure 1D:
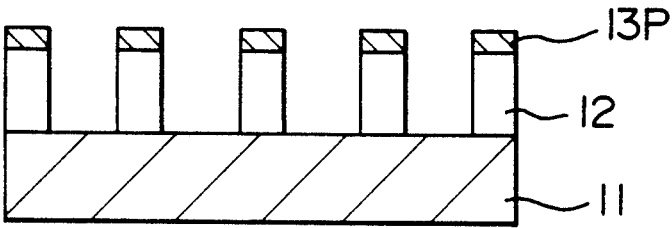

First, an outline of the present invention will be described. The present invention intends to solve the above problems by using a three-component type material comprising an acid generator capable of generating an acid by the irradiation with an electric charged beam, e.g., an electron beam, focused ion beam, etc., a polymer to be degraded by the acid, and a silicone resin. Further, a conducting polysilane is used as the silicone resin.

The acid generator capable of generating an acid by irradiation with an electric charged beam includes halogenide organic compounds, onium salts, and the like. The halogenide organic compounds include, for example, 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, 2-chloro-6-(trichloromethyl)pyridine, and the like. Further, the onium salts include the following substances, and the like:

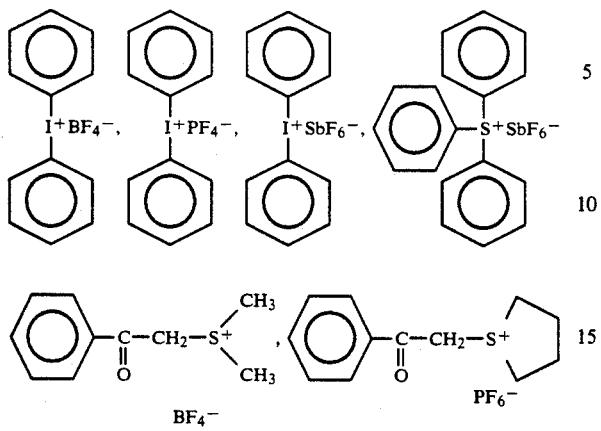

These compounds generate a Lewis acid as a strong acid by the irradiation with an electric charged beam such as an electron beam.

The polymer (also referred to herein as acid degradation polymer) to be degraded by the acid preferably includes, for example, the following compounds which have a C—O—C bond at the principal chain or side chain thereof:

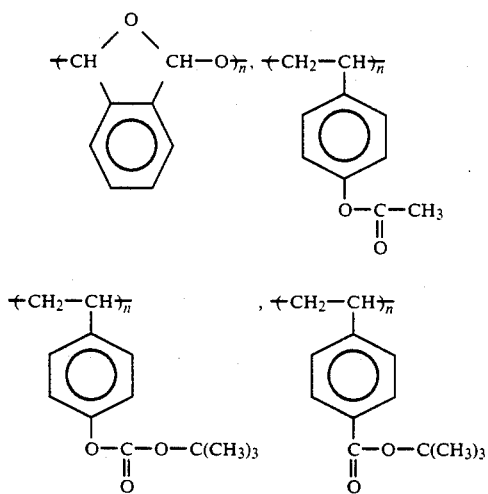

These compounds allow the following reaction to proceed in the presence of an acid, which is converted into a substance having alkaline solubility.

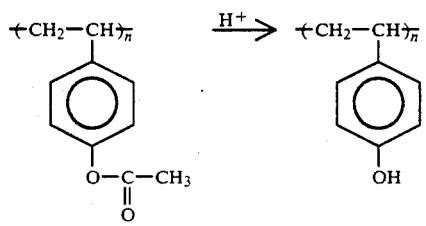

Further, the silicone resins used here as a matrix polymer must have alkaline solubility, and the following resins, for example, have the alkaline solubility.

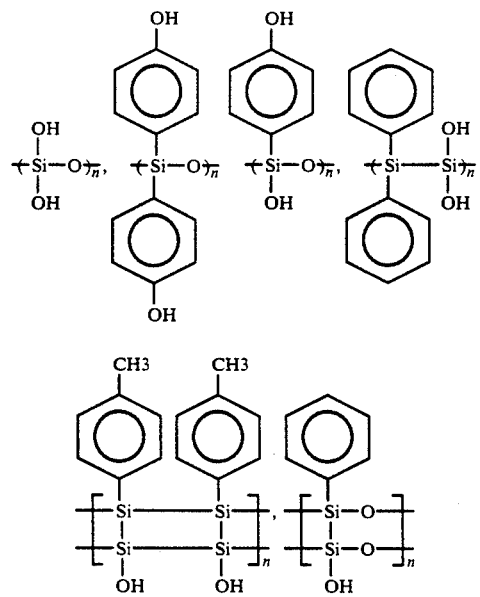

Writing a pattern by an electric charged beam causes the acid generator to generate a Lewis acid, by which the polymers having a C—O—C bond are degraded and made alkaline-soluble. Since the silicone resins are originally alkaline soluble, a region where a pattern is written is dissolved in an alkaline developer, and since the acid degradation polymer acts as a dissolution inhibitor, a region where a pattern is not written is difficult to be dissolved in an alkaline solution, so that a positive type pattern can be formed.

Further, since these silicone resins have a low surface resistance and are a conducting polymer, they can prevent the occurrence of charging caused when the pattern is written.

The use of these silicon containing substances as an upper-layer resist of a two-layer resist enables a multi-layer resist to be easily formed. This multi-layer resist can easily form an accurate positive type fine resist pattern, in which no charging is caused, because the multi-layer resist has sufficiently high dry etching resistance, sufficiently high sensitivity due to chemical amplification, and conductivity, and which is not bad for the environment and human bodies, because it can use an alkaline solution as the developer.

Further, the above problems can be also solved by using, as a resist, a three-component type material comprising an acid generator capable of generating an acid by the irradiation with a charged beam, e.g., an electron beam, a monomer to be reacted by the acid, and a silicone resin.

Conducting polysilane and the like can be used as the silicone resin.

The acid generator includes halogenide organic compounds, onium salts, and the like, as described above.

The monomer to be reacted by the acid includes melamine, methylol melamine, and the like. Methylol melamine is represented by the following formula, in which —OH base is eliminated by acid:

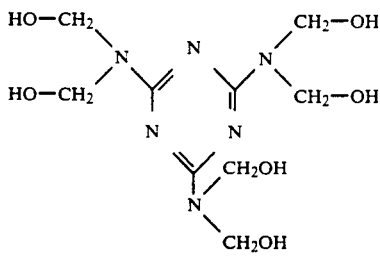

These compounds cause a cross-linking reaction with the silicone resin as a matrix polymer.

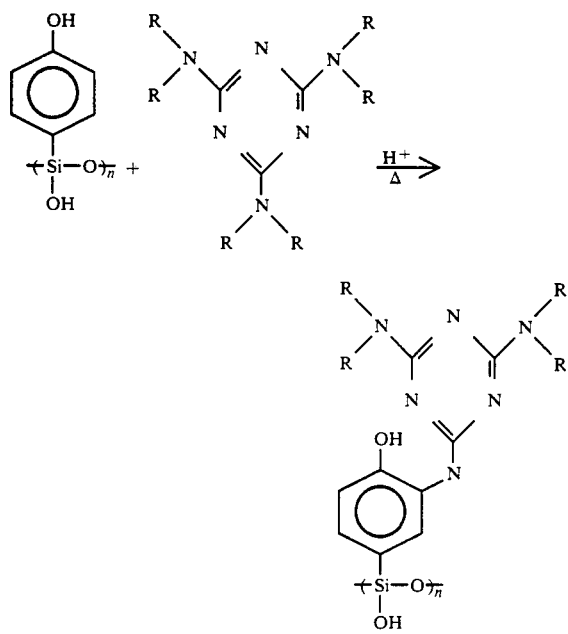

R:H, CH2OH, etc. The above cross-linking reaction proceeds to form the three-dimensional cross-linkage in the silicone resins. Writing a pattern by an electron beam, for example, causes the acid generator to produce a Lewis acid, by which the monomer such as melamine or the like is reacted with the silicone resin to form a cross-linking structure Since the silicone resins originally have alkaline solubility, a region where a pattern is not written is dissolved in an alkaline developer, and a region where a pattern is written is difficult to be dissolved in an alkaline solution, because it is cross-linked, so that a negative type pattern is formed.

Further, these silicone resins have a low surface resistance and are conducting polymers, they can prevent the occurrence of charging caused when the pattern is written.

The use of these silicon containing substances as an upper-layer resist of a two-layer resist enables a multi-layer resist to be easily formed. This multi-layer resist can easily form an accurate negative type fine resist pattern, in which no charging is caused, because the multi-layer resist has sufficiently high dry etching resistance, sufficiently high sensitivity due to chemical amplification, and conductivity, and which is not bad for the environment and human bodies, because it can use an alkaline solution as the developer.

EXAMPLE 1

FIG. 1 A–D shows an embodiment according to the present invention. An organic polymer film was applied on a semiconductor substrate 11 to a thickness of 2 microns as a bottom layer 12 and baked at 220° C. for 20 minutes (FIG. 1A). A substance obtained in the following Example 2 was applied thereon to a thickness of 0.5 micron as an upper layer electron beam resist 13 and baked at 90° C. for 20 minutes (FIG. 1B). Next, a pattern was written by an electron beam with an accelerating voltage of 20 KV and a dosage of 10 $\mu C/cm^2$. Baking was carried out at 120° for 20 minutes, and deesterification by the generated acid was accelerated. The wafer was developed in an alkaline solution for 6 minutes, whereby an accurate positive type fine resist pattern 13P could be obtained (FIG. 1C). The bottom layer 12 was etched using the resist pattern as a mask to obtain an accurate vertical fine resist pattern (FIG. 1D). As described above, according to the present invention, when a highly sensitive silicon containing resist is used as the upper layer resist of a two-layer resist, a highly accurate positive type fine resist pattern can be formed.

EXAMPLE 2

An acid generator consisting of 1,1-bis[p-chlorphenyl]-2,2,2-trichloroethane in an amount of 1.0 g, ethyl polymethacrylate in an amount of 10 g, and poly(p-hydroxyphenylsiloxane) in an amount of 15 g were dissolved in an ethyl celosolve acetate solution to make a mixture. The mixture was slowly stirred at 25° C. for 5 minutes and a uniform solution was prepared by filtering out insoluble substances therefrom. The solution was dropped onto a semiconductor substrate and spin coated at 2000 rpm for 2 minutes. The wafer was baked at 90° C. for 20 minutes, whereby a resist film having a thickness of 1.0 micron could be obtained. Next, a pattern was written with an accelerating voltage of 30 KV and a dosage of 10 $\mu C/cm^2$, then the wafer was baked at 110° C. for 20 minutes. Then the deesterification of ethyl polymethacrylate was accelerated by the generated acid. When the wafer was developed in an organic alkaline solution for 6 minutes, an accurate positive type fine resist pattern could be obtained.

EXAMPLE 3

A mixture was prepared by dissolving an acid generator consisting of 1,1-bis[p-methoxyphenyl]-2,2,2-trichloroethane in an amount of 1.0 g, poly(p-vinyl benzoate) in an amount of 10.0 g, and poly(p-hydroxyphenylsilane) in an amount of 15 g in a celosolve acetate solution, in the same manner as in Example 2. The mixture was slowly stirred at 25° C. for 5 minutes and a uniform solution was prepared by filtering out insoluble substances therefrom. The solution was dropped onto a semiconductor substrate and spin coated at 2000 rpm for 2 minutes. The wafer was baked at 90° C. for 20 minutes thereby to obtain a resist film having a thickness of 1.0 micron. Next, a pattern was written with an accelerating voltage of 30 KV and a dosage of 10 $\mu C/cm^2$, and the wafer was baked at 100° C. for 20 minutes. Then the deesterification of the poly(p-vinyl benzoate) was accelerated by the generated acid. When the wafer was developed in an organic alkaline solution for 6 minutes, an accurate positive type fine resist pattern could be obtained.

EXAMPLE 4

Figure 2A:
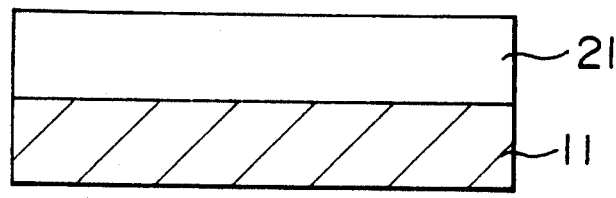
FIGS. 2A to 2D are cross sectional views of a manufacturing process of another embodiment according to the present invention.
Figure 2B:
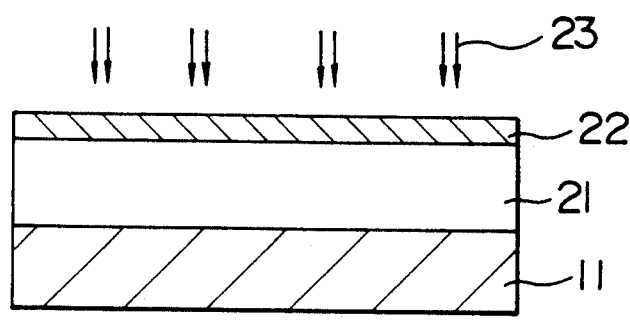
Figure 2C:
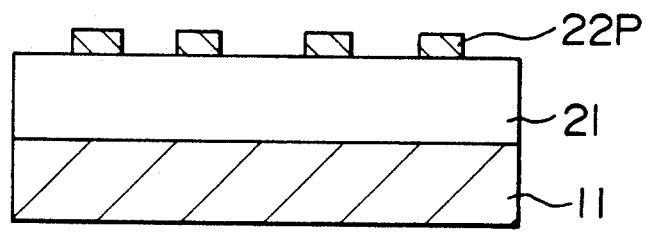
Figure 2D:
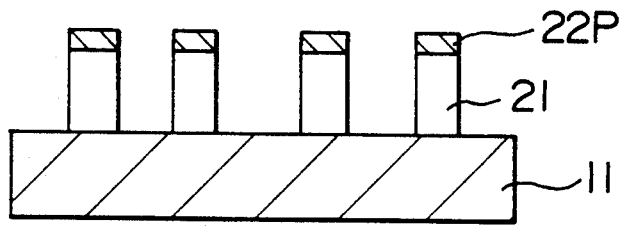
Figure 3A:
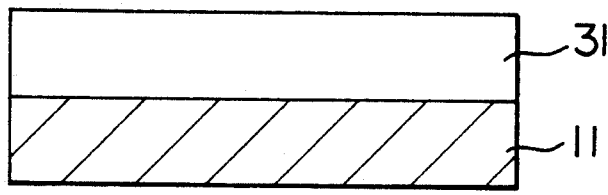
FIGS. 3A to 3D are cross sectional views of a manufacturing process of a prior art multi-layer resist process.
Figure 3B:
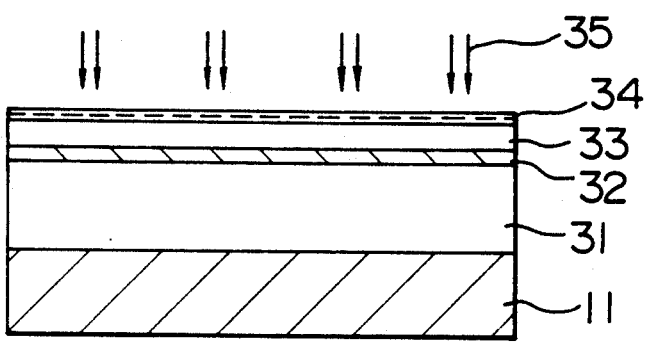
Figure 3C:
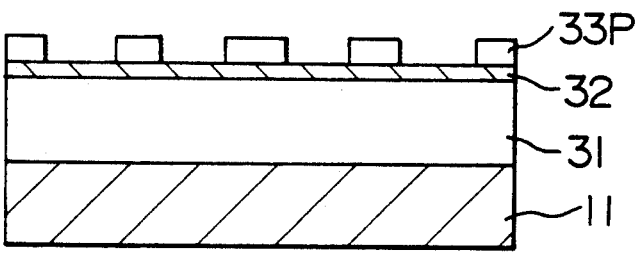
Figure 3D:
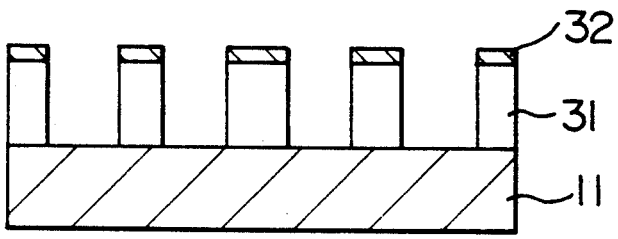

FIG. 2A-D shows a fourth embodiment according to the present invention. An organic polymer film was applied on a semiconductor substrate 11 to a thickness of 2 microns as a bottom layer 21 and baked at 220° C. for 20 minutes (FIG. 2A). A substance obtained in the following Example 5 was applied thereon to a thickness of 0.5 micron as an upper layer electron beam resist 22 and baked at 90° C. for 20 minutes (FIG. 2B). Next, a pattern was written by an electron beam with an accelerating voltage of 20 KV and a dosage of 10 $\mu$C/cm$^2$, baking was carried out at 120° C. for 20 minutes and cross-linking by the generated acid was accelerated The wafer was developed in an alkaline solution for 6 minutes, whereby an accurate negative type fine resist pattern 22P could be obtained (FIG. 2C). The bottom layer 21 was etched using the resist pattern as a mask thereby to obtain an accurate vertical fine resist pattern (FIG. 2D). As described above, according to the present invention, when a highly sensitive silicon containing resist is used as the upper layer resist of a two-layer resist, a highly accurate negative type fine resist pattern can be formed.

EXAMPLE 5

An acid generator consisting of 1,1-bis[p-chlorophenyl]-2,2,2-trichloroethane in an amount of 1.0 g, methylol melamine in an amount of 2.0 g, and poly(p-hydroxyphenylsiloxane) in an amount of 15 g were dissolved in an ethyl cellosolve acetate solution to make a mixture. The mixture was slowly stirred at 25° C. for 5 minutes and a uniform solution was prepared by filtering out insoluble substances therefrom. The solution was dropped onto a semiconductor substrate and spin coated at 2000 rpm for 2 minutes. The wafer was baked at 90° C. for 20 minutes, whereby a resist film having a thickness of 1.0 micron was obtained. Next, a pattern was written with an accelerating voltage of 30 KV and a dosage of 10 $\mu$C/cm$^2$, and then the wafer was baked at 110° C. for 20 minutes. Then the cross-linking of the melamine with the polysiloxane was accelerated by the generated acid. When the wafer was developed in an organic alkaline solution for 6 minutes, an accurate negative type fine resist pattern could be obtained.

EXAMPLE 6

A mixture was prepared by dissolving an acid generator consisting of 1,1-bis[p-methoxyphenyl]-2,2,2-trichloroethane in an amount of 1.0 g, methylol melamine in an amount of 2.0 g, and poly(p-hydroxyphenylsilane) in an amount of 15 g in a cellosolve acetate solution, in the same manner as in Example 5. The mixture was slowly stirred at 25° C. for 5 minutes and a uniform solution was prepared by filtering out insoluble substances therefrom The solution was dropped onto a semiconductor substrate and spin coated at 2000 rpm for 2 minutes. The wafer was baked at 90° C. for 20 minutes, whereby a resist film having a thickness of 1.0 micron could be obtained Next, a pattern was written with an accelerating voltage of 30 KV and a dosage of 10 $\mu$C/cm$^2$, and then the wafer was baked at 110° C. for 20 minutes, and then the cross-linking of melamine with polysilane was accelerated by the generated acid. When the wafer was developed in an organic alkaline solution for 6 minutes, an accurate positive type fine resist pattern could be obtained.

What is claimed is:

1. A fine pattern forming method comprising the steps of:
    applying an organic polymer film on a semiconductor substrate and heat treating the same;
    applying a resin solution comprising an acid degradation polymer, an acid generator capable of generating an acid by irradiation with an electric charged beam, and an alkaline soluble silicone resin on said organic polymer layer and heat treating the same;
    writing a pattern on said resin with said electric charged beam to generate the acid from said acid generator;
    heat treating said resin to react the acid generated from said acid generator with said acid degradation polymer to convert the acid degradation polymer into a substance having alkaline solubility;
    carrying out a development in an alkaline solution to form a resist pattern; and
    etching said organic polymer layer using said resist pattern as a mask.

2. A fine pattern forming method according to claim 1, wherein said silicone resin is one member selected from the group consisting of a conducting polysilane polymer and a conducting polysilicone polymer to prevent charging when the pattern is written by the electric charged beam and form an accurate fine resist pattern.

3. A fine pattern forming method according to claim 2, wherein said electric charged beam is an electron beam.

4. A fine pattern forming method according to claim 1, wherein said electric charged beam is an electron beam.

5. A fine pattern forming method comprising the steps of:
    applying an organic polymer film on a semiconductor substrate and heat treating the same;
    applying a resin solution comprising an acid reactive monomer, an acid generator capable of generating an acid by irradiation with an electric charged beam, and an alkaline soluble silicone resin on said organic polymer layer and heat treating the same;
    writing a pattern on said resin with said electric charged beam to generate the acid from said acid generator;
    heat treating said resin to react the acid generated from said acid generator with said acid reactive polymer to allow the acid reactive monomer to cross-link with said alkaline soluble silicone resin;
    carrying out a development in an alkaline solution to form a resist pattern; and
    etching said organic polymer layer using said resist pattern as a mask.

6. A fine pattern forming method according to claim 5, wherein said silicone resin is one member selected from the group consisting of a conducting polysilane polymer and a conducting polysilicone polymer to prevent charging when the pattern is written by the electric charged beam and form an accurate fine resist pattern.

7. A fine pattern forming method according to claim 6, wherein said electric charged beam is an electron beam.

8. A fine pattern forming method according to claim 5, wherein said electric charged beam is an electron beam.

* * * * *